United States Patent
Anders et al.

(10) Patent No.: US 7,196,548 B2
(45) Date of Patent: Mar. 27, 2007

(54) SINGLE ENDED CURRENT-SENSED BUS WITH NOVEL STATIC POWER FREE RECEIVER CIRCUIT

(75) Inventors: Mark A. Anders, Hillsboro, OR (US); Atul Maheshwari, Amherst, MA (US); Ram Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 107 days.

(21) Appl. No.: 10/927,574

(22) Filed: Aug. 25, 2004

(65) Prior Publication Data

US 2006/0044017 A1   Mar. 2, 2006

(51) Int. Cl.
*H03K 19/094* (2006.01)
*H03K 17/16* (2006.01)

(52) U.S. Cl. ............................ 326/86; 326/26; 326/27; 326/28; 326/95; 326/98

(58) Field of Classification Search ................ 326/121, 326/119, 112, 26–28, 93–98, 86
See application file for complete search history.

(56) References Cited

U.S. PATENT DOCUMENTS

| | | | |
|---|---|---|---|
| 5,399,918 A * | 3/1995 | Taylor et al. ................ | 326/110 |
| 6,028,454 A * | 2/2000 | Elmasry et al. .............. | 326/115 |
| 6,396,305 B1 * | 5/2002 | Carlson ........................ | 326/98 |
| 6,690,204 B1 * | 2/2004 | Belluomini et al. ........... | 326/95 |
| 6,693,459 B2 * | 2/2004 | Nedovic et al. ............... | 326/93 |
| 6,888,377 B2 * | 5/2005 | Ngo .............................. | 326/95 |
| 6,952,118 B2 * | 10/2005 | Jamshidi et al. .............. | 326/98 |

* cited by examiner

*Primary Examiner*—Rexford Barnie
*Assistant Examiner*—Jason Crawford
(74) *Attorney, Agent, or Firm*—Blakely, Sokoloff, Taylor & Zafman LLP

(57) ABSTRACT

A single ended current sensed bus with novel static power free receiver circuit is described herein. In one embodiment, a receiver circuit example includes a latch circuit to latch values for a first output and a second output during an evaluation phase in response to an input, a pre-charge circuit coupled to the latch circuit to pre-charge the latch circuit during a pre-charge phase, and a static power dissipation blocking (SPDB) circuit coupled to the pre-charge circuit and the latch circuit to substantially block static power from being dissipated during the pre-charge phase. Other methods and apparatuses are also described.

27 Claims, 10 Drawing Sheets

SINGLE ENDED CURRENT-SENSED BUS WITH NOVEL STATIC POWER FREE RECEIVER CIRCUIT

FIELD

Embodiments of the invention relate to interconnect systems; and more specifically, to a static power free receiver circuit of an interconnect system.

BACKGROUND

On-chip global interconnect delay tends to increase with successive technology generations. For high-speed on-chip interconnects, dynamic buses have been able to reduce interconnect delays over static buses. The Miller coupling factor (MCF), which determines the effective coupling capacitance to neighboring wires, reduces from a worst-case of 2 for static buses to 1 for dynamic buses, thus reducing the interconnect delay. FIG. 1 is a block diagram illustrating a pipeline stage consisting of a typical dynamic bus topology.

However, with scaling even dynamic bus fails to satisfy the ever increasing demands for high performance. Moreover, dynamic buses tend to consume significant power even at low input switching activities commonly seen in microprocessor buses. Since dynamic buses are pre-charged every clock cycle, the power consumption remains high even when there is no input switching activity. The aggressively sized repeaters normally inserted along the dynamic bus further degrade power numbers.

Current sensing has been proposed as a high performance circuit technique. FIG. 2 is a block diagram illustrating a typical interconnect using the conventional current-sensing technique. FIG. 3 is a block diagram illustrating a receiver circuit that can be used in the interconnect shown in FIG. 2. The main difference between current-mode and voltage-mode signaling is the termination of wire. In current sensing, the line is terminated by a short, thus shunting the wire capacitance. By avoiding the charging of the wire capacitance, a current-sensing system is faster and can save power.

The current-sensing receiver works as follows. Referring to FIG. 3, initially, on assertion of the CLK signal, two outputs, OUT and OUTB, equalize by transistor M8. Equal amounts of current flow through the two legs of the sense amplifier. A differential current applied to IN and INB breaks the metastable balance, and when CLK is de-asserted the cross-coupled latch (M1–M4) switches thus giving a voltage output determined by the differential current between IN and NB. Transistors M5 and M6 provide the low impedance termination.

Although the current-sensing technique shown in FIGS. 2 and 3 provides higher performance, it suffers from two major drawbacks: it is differential in nature and hence needs double the wires than the conventional dynamic bus. Moreover, such a current sensing suffers from static power dissipation and thus makes it power inefficient for low-activity buses.

DESCRIPTION OF THE DRAWINGS

The invention may best be understood by referring to the following description and accompanying drawings that are used to illustrate embodiments of the invention. In the drawings.

DETAILED DESCRIPTION

A static power free receiver circuit is described herein. In one embodiment, a receiver circuit example employs a single ended current-sensing technique using a single ended input instead of differential inputs in a conventional receiver circuit. Thus, the single ended receiver circuit utilizes the same number of wires as a dynamic bus where the single ended receiver circuit may be used. In addition, the receiver circuit consumes substantially low static power; particularly, during a pre-charge phase of the receiver circuit and thus makes current sensing applicable to a low activity cache bus.

In the following description, numerous specific details are set forth (e.g., such as logic resource partitioning/sharing/duplication implementations, types and interrelationships of system components, and logic partitioning/integration choices). However, it is understood that embodiments of the invention may be practiced without these specific details. In other instances, well-known circuits, software instruction sequences, structures and techniques have not been shown in detail in order not to obscure the understanding of this description.

References in the specification to "one embodiment", "an embodiment", "an example embodiment", etc., indicate that the embodiment described may include a particular feature, structure, or characteristic; but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct contact with each other (e.g., physically, electrically, optically, etc.). "Coupled" may mean that two or more elements are in direct contact (physically, electrically, optically, etc.). However, "coupled" may also mean that two or more elements are not in direct contact with each other, but yet still co-operate or interact with each other.

Figure 1:
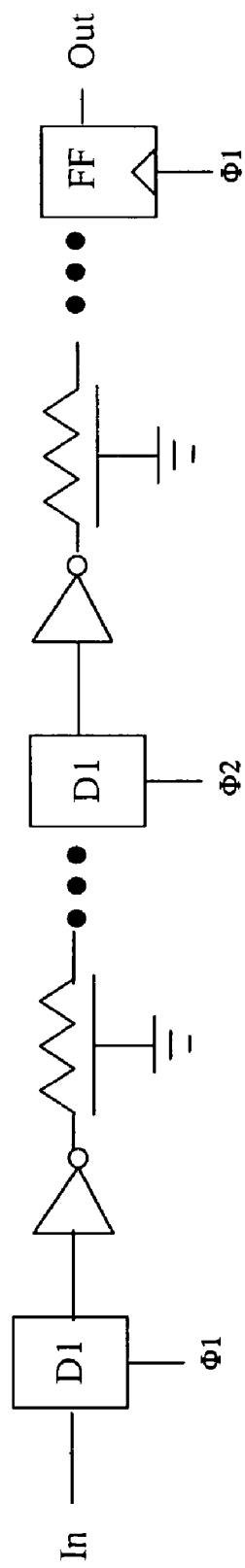
FIG. 1 is a block diagram illustrating a pipeline stage consisting of a typical dynamic bus topology.
Figure 2:
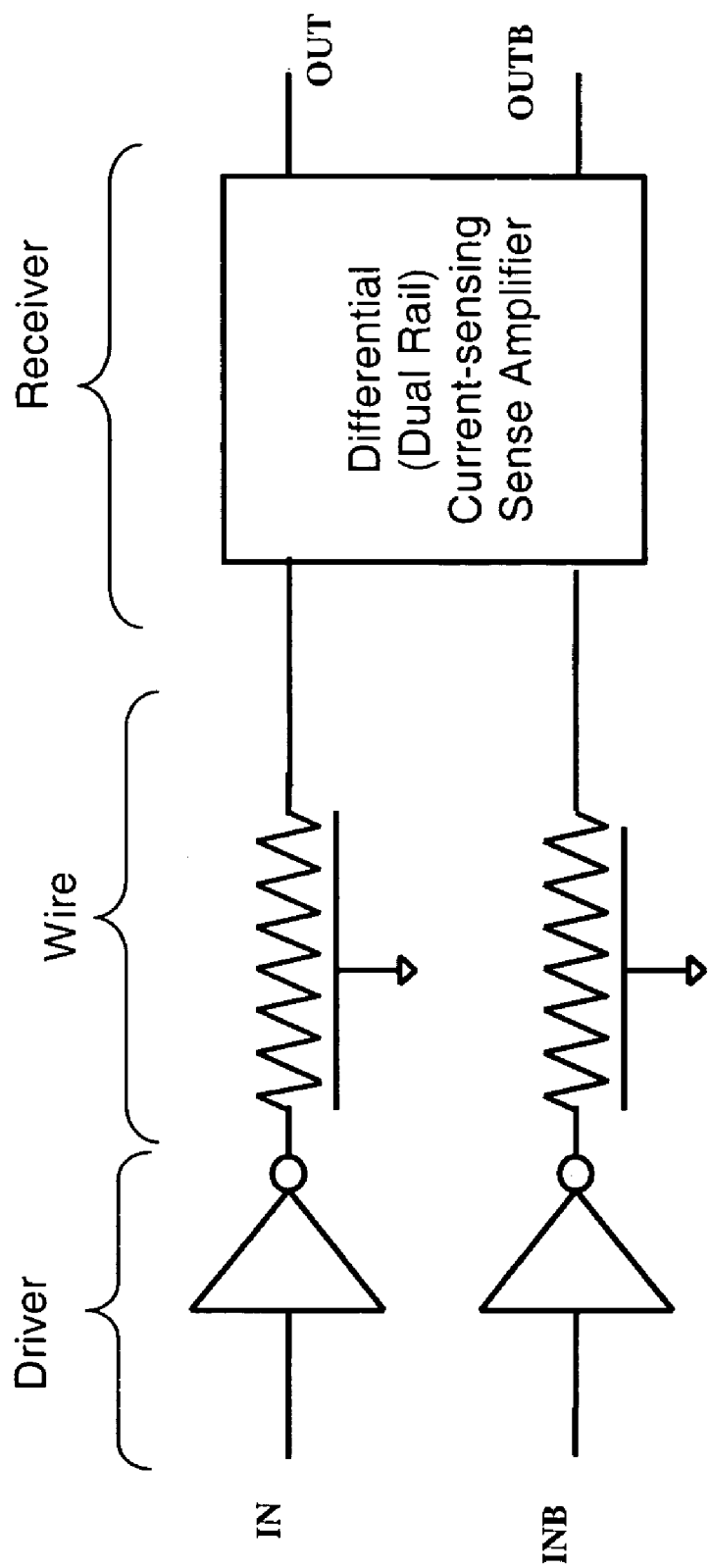
FIG. 2 is a block diagram illustrating a typical interconnect using the conventional current-sensing technique.
Figure 3:
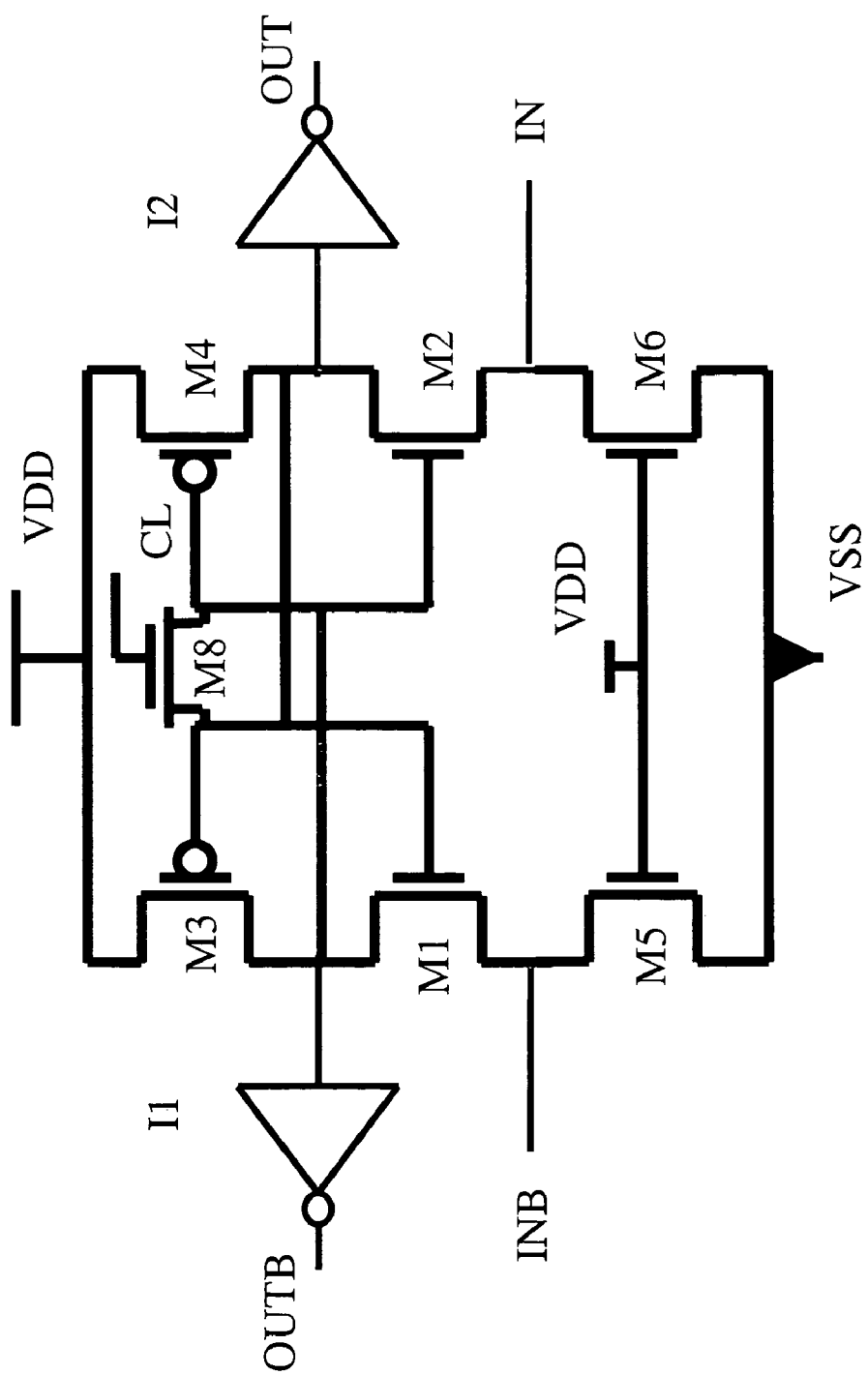
FIG. 3 is a block diagram illustrating a conventional receiver circuit.
Figure 4:
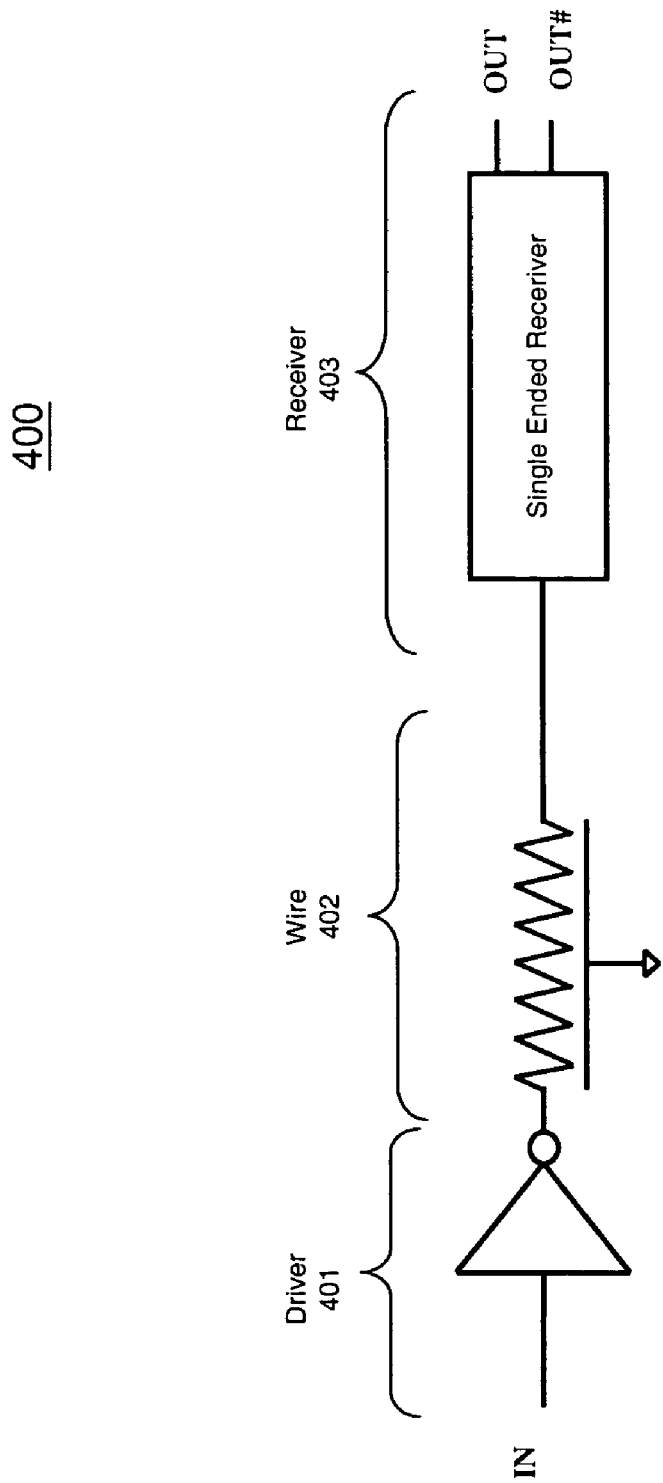
FIG. 4 is a block diagram illustrating an interconnect system according to one embodiment.

FIG. 4 is a block diagram illustrating an interconnect system according to one embodiment. For example, the interconnect example 400 may be used as one of the interconnects shown in the dynamic bus of FIG. 1. Alternatively, the interconnect example 400 may be a relatively long point-to-point on-chip data path interconnect such as may be included in a microprocessor, digital signal processor, memory chip, or other integrated circuit chip, or to be used between chips.

In one embodiment, the interconnect example 400 includes a driver 401, a termination wire 402, and a single ended receiver 403 employing current sensing techniques. Unlike a conventional differential current sensing receiver which requires dual inputs, the single ended receiver 403 employs a single input. Dependent upon the current sensed at the single input, the single ended receiver 403 delivers outputs OUT and OUT#, which is complementary to OUT. In addition, during a pre-charge phase, static power dissipated by the single ended receiver 403 is maintain substantially low with respect to the static power consumed by a conventional receiver circuit.

Figure 5:
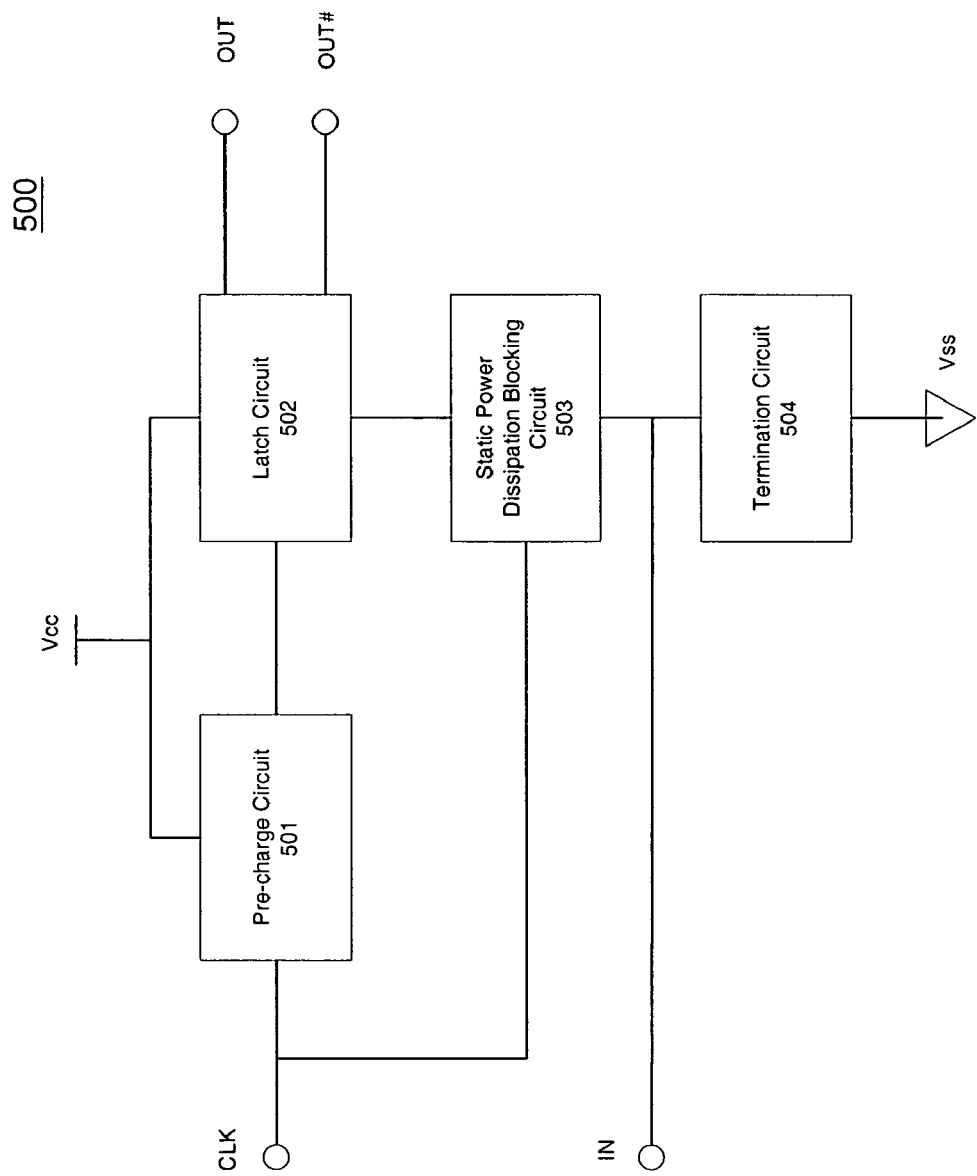
FIG. 5 is a block diagram illustrating a receiver circuit in accordance with one embodiment.

FIG. 5 is a block diagram illustrating a receiver circuit in accordance with one embodiment. For example, the receiver circuit 500 may be an example of receiver circuit 403 of FIG. 4. In one embodiment, the receiver circuit 500 includes, but is not limited to, a latch circuit to latch values for a first output and a second output during an evaluation phase in response to an input, a pre-charge circuit coupled to the latch circuit to pre-charge the latch circuit during a pre-charge phase, and a static power dissipation blocking (SPDB) circuit coupled to the pre-charge circuit and the latch circuit to substantially block static power from being dissipated during the pre-charge phase.

Referring to FIG. 5, receiver circuit example 500 includes a pre-charge circuit 501, a latch circuit 502, a SPDB circuit 503, and a termination circuit 504. In the embodiment shown in FIG. 5, the pre-charge circuit 501 is coupled to the latch circuit 502 and both the pre-charge circuit 501 and the latch circuit are coupled to a first supply rail Vcc. The pre-charge circuit 501 pre-charges the latch circuit 502 during a pre-charge phase of the receiver circuit 500. During an evaluation phase, the latch circuit 502 latches OUT and OUT# to voltages relatively equivalent to the first supply rail Vcc or a second supply rail Vss, where Vcc>Vss, dependent upon an amount of current sensed at an input IN.

It is to be understood that the term "supply rail" is in general some kind of conductive material. For example, a copper interconnect, power plane, doped polysilicon, or the integrated circuit substrate itself upon which the circuit example 500 is formed. The voltage Vss of the second supply rail may or may not necessarily be a ground voltage by which other voltages are referenced to.

In one embodiment, the termination circuit 504 provide relatively low impedance path for the latch circuit during the evaluation phase. In addition, the SPDB circuit 503 may be used to block static power from being dissipated from latch circuit 502 to the termination circuit 504. In one embodiment, during the pre-charge phase, the SPDB circuit 503 substantially isolates the latch circuit 502 from the termination circuit 504. As a result, during the pre-charge phase, substantially low static current flowing through the termination circuit.

During the evaluation phase, the SPDB circuit 503 allows currently flowing from the latch circuit 502 to the termination circuit 504. The outputs OUT and OUT# are latched by the latch circuit 502 dependent upon an amount of current sensed at the input IN. In one embodiment, the output OUT is latched to a voltage substantially equivalent to the first supply rail Vcc and the output OUT# is latched to a voltage substantially equivalent to the second supply rail Vss when an amount of current sensed at the input IN exceeds a first predetermined threshold. Likewise, the output OUT is latched to a voltage substantially equivalent to the second supply rail Vss and the output OUT# is latched to a voltage substantially equivalent to the first supply rail Vcc when an amount of current sensed at the input IN drops below a second predetermined threshold. The first and second predetermined thresholds may be determined based on at least one characteristic of the termination circuit 504; For example, the impedance of the termination circuit.

Furthermore, a clock signal CLK is coupled to the pre-charge circuit 501 and the SPDB circuit 503. The clock signal CLK may be used to control the pre-charge phase and the evaluation phase. According to one embodiment, when the clock signal CLK is at a first state, the receiver circuit 500 is in a pre-charge phase and the receiver circuit 500 is in an evaluation phase when the clock signal CLK is at a second state. In a particular embodiment, the receiver circuit 500 enters a pre-charge phase when the clock signal CLK is at a logical low level (e.g., logical zero) and the receiver circuit 500 enters an evaluation phase when the clock signal CLK is at a logical high level (e.g., logical one). Other configurations may exist.

Figure 6:
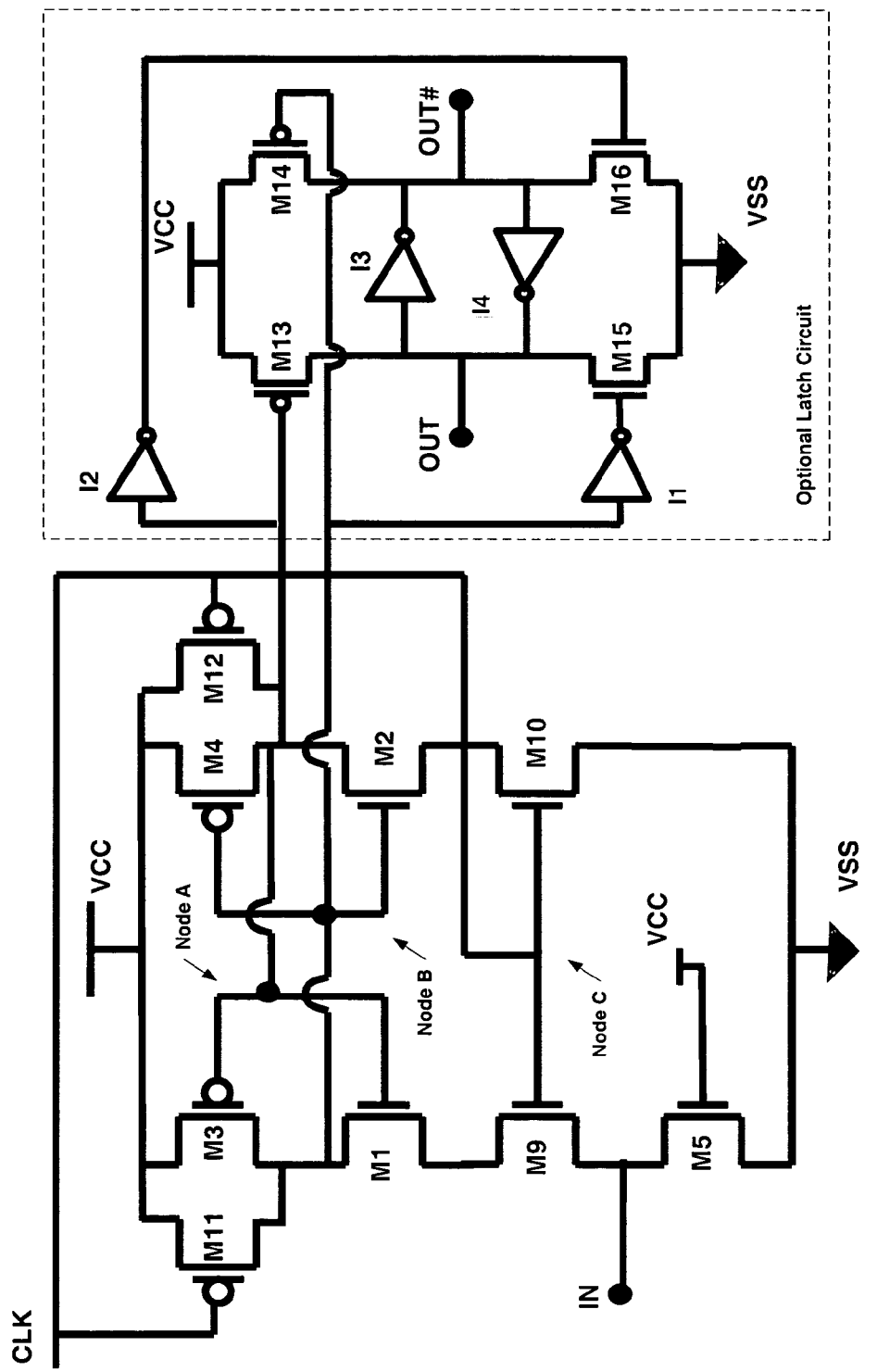
FIG. 6 is a block diagram illustrating a receiver circuit according to an alternative embodiment.

FIG. 6 is a block diagram illustrating a receiver circuit according to an alternative embodiment. For example, the receiver circuit 600 may be implemented as an example of receiver circuit 500 shown in FIG. 5. Similar to receiver circuit 500 of FIG. 5, receiver circuit example 600 includes a pre-charge circuit, a latch circuit, a SPDB circuit, and a termination circuit. Referring to FIG. 6, in one embodiment, the pre-charge circuit includes p-channel field effect transistors (pFETs) M11 and M12. The latch circuit includes a first inventor having a pFET M3 and an n-channel field effect transistor (nFET) M1 and a second inverter having a pFET M4 and an nFET M2. The first and second inverters are cross-coupled to form the latch circuit. The SPDB circuit includes an nFET M9 and an nFET M10. The termination circuit includes an nFET M5.

Specifically, according to one embodiment, the gates of pFETs M11 and M12 are coupled to a clock signal CLK. The drains of pFETs M11 and M12 are coupled to the first supply rail Vcc, which is also coupled to the drains of pFETs M3 and M4. The sources of pFETs M3 and M4 are coupled to the drains of nFETs M1 and M2. In addition, the gates of pFET M3 and nFET M1, the sources of pFETs M4 and M12, and the drain of nFET M2 are coupled each other to form a node A, which is referred to as a first output. The gates of pFET M4 and nFET M2, the sources of pFET M11 and pFET M3, and the drain of nFET M1 are coupled to each other to form a node B, which is referred to as a second output. The sources of nFET M1 and nFET M2 are coupled to the drains of nFETs M9 and M10 respectively. The gates of nFET M9 and nFET M10 are coupled to the clock signal CLK, which forms a node C. The source of nFET M9 is coupled to the drain of nFET M5, which forms an input IN to receive input signals. The gate of nFET M5 is coupled to the first supply rail Vcc while the source of nFET M5 is coupled to the second supply rail Vss.

In addition, according to one embodiment, the receiver circuit example may optionally include an external SR (set-reset) latch circuit coupled to the output nodes A and B.

In one embodiment, the SR latch circuit includes nFETs M15 and M16, and pFETs M13 and M14 cross coupled to each other via invertors I3 and I4. Specifically, the drains of pFETs M13 and M14 are coupled to the first supply rail Vcc while the sources of nFETs M15 and M16 are coupled to the second supply rail Vss. In one embodiment, node A is coupled to the gate of pFET M13 and is coupled to the gate of nFET M16 via an inverter I2. Node B is coupled to the gate of pFET M14 and is coupled to the gate of nFET M15 via an inverter I1. The source of pFET M13, the drain of nFET M15, an input of inverter I3, and an output of inverter I4 are coupled to each other to form a first output OUT. The source of pFET M14, the drain of nFET M16, an output of inverter I3, and an input of inverter I4 are coupled to each other to form a second output OUT#, which may be complementary to the first output OUT.

In one embodiment, the receiver circuit example is in a pre-charge phase when the clock signal CLK is at a first state and is in an evaluation phase when the clock signal CLK is at a second state. In a particular embodiment, the first state may be substantially equivalent to the second supply rail Vss and the second state may be substantially equivalent to the first supply rail Vcc. In one embodiment, during the pre-charge phase, the pre-charge circuit pre-charges the latch circuit substantially closed to the first supply rail Vcc. Meanwhile, the SPDB circuit may isolate the latch circuit from the termination circuit. As a result, no static power is dissipated during the pre-charge phase.

Specifically, during the pre-charge phase, the clock signal CLK is at a low state that turns on the pFETs M11 and M12, which in turn pull the nodes A and B substantially closed to the first supply rail Vcc. Meanwhile, the clock signal CLK causes the SPDB circuit nFETs M9 and M10 to be turned off. As a result, substantially no current flowing through the latch circuit (e.g., M1–M4) because the latch circuit has been substantially isolated by the SPDB circuit nFETs M9 and M10, regardless the state of input IN. Since nodes A and B are pulled up to Vcc, the outputs OUT and OUT# stay substantially closed to the second supply rail Vss. This ensures that the CMOS (complementary metal-oxide semiconductor) circuit (not shown) that may be coupled to the outputs OUT and OUT# does not suffer from the static power lost during the pre-charge phase.

During the evaluation phase, the clock signal CLK swings from the first state to the second state (e.g., from Vss to Vcc). As a result, the pre-charge circuit pFETs M11 and M12 are turned off and the SPDB circuit nFETs M9 and M10 are turned on via node C pulled up by the clock signal CLK. Together with nFETs M9 and M10, nFET M5 provides a relatively low impedance path to the latch circuit.

In addition, during the evaluation phase, one of the nodes A and B is pulled down dependent upon the state of the input IN. In one embodiment, one of the nodes A and B is pulled down dependent upon an amount of current and/or voltage sensed at the input IN. Initially, when an amount of current sensed at the input IN is not large enough (e.g., below a predetermined threshold), there is no current pushed through the termination circuit nFET M5. As a result, node B remains high (e.g., closed to Vcc). However, node A is pulled down by the nFET M10 which is turned on by a high state of clock signal CLK.

As an amount of current sensed at the input IN increases, the amount of current sensed at the input exceeds a certain threshold (e.g., enough current pushed through the termination circuit nFET M5). In which case, node B is pulled down, which also pulls down the gate of pFET M4 and nFET M2. As a result, pFET M4 is turned on and nFET M2 is turned off to cause node A to be pulled up. The pulled up node A further turns off pFET M3 and turns on nFET M1 to further latch the state of node B.

Figure 7:
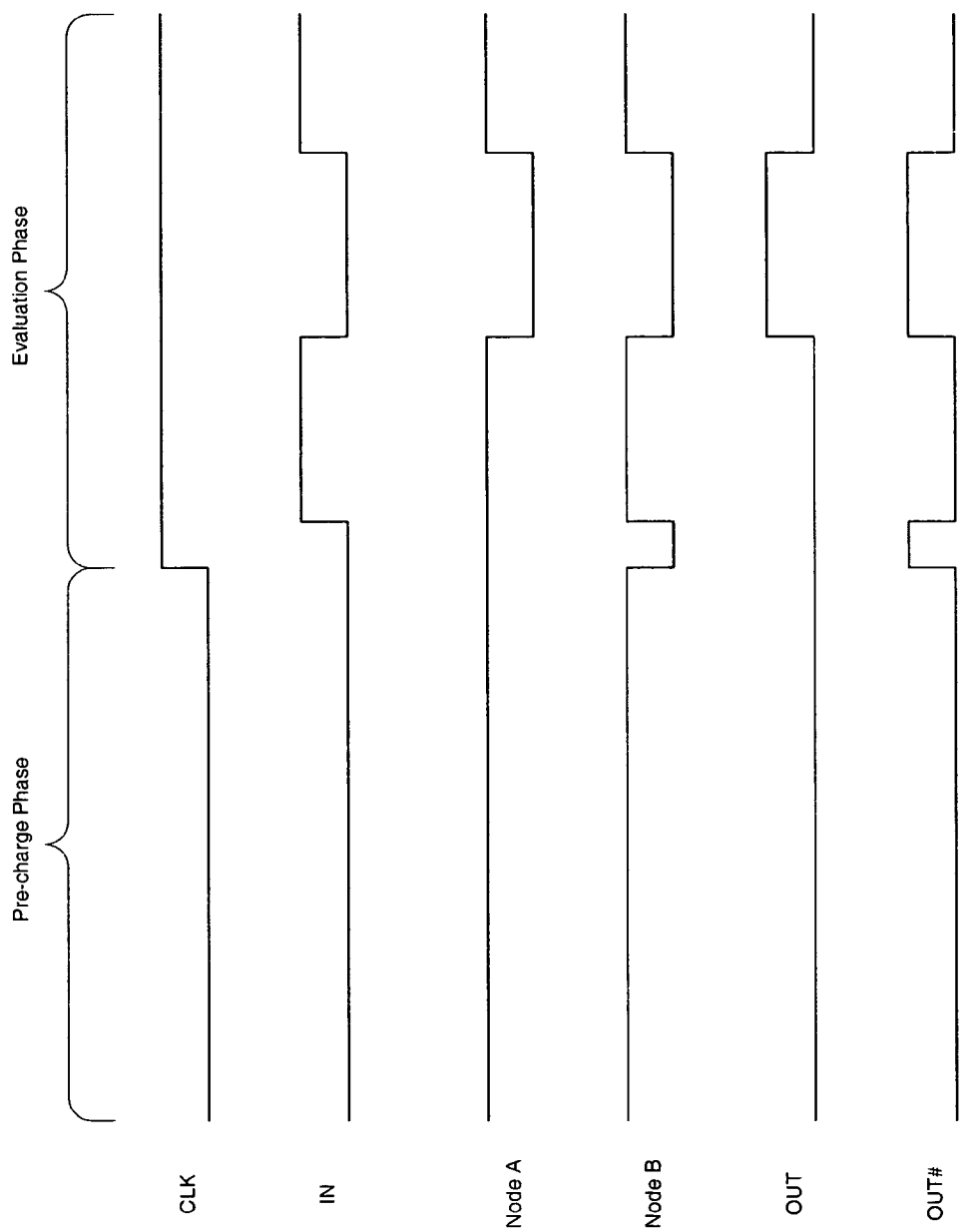
FIG. 7 is a timeline diagram illustrating various states of several nodes during the pre-charge phase and evaluation phase.

With respect to the optional SR latch circuit, when node A is high, pFET M13 is turned off and nFET M16 is turned off via inverter I2. Meanwhile, since node A is high, node B is low to turn on pFET M14 and turn on nFET M15 via inverter I1. As result, OUT# is pulled up and OUT is pulled down. Similarly, when node A is low, pFET M13 is turned on and nFET M16 is turned on via inverter I2. Meanwhile, since node A is high, node B is low to turn off pFET M14 and turn off nFET M15 via inverter I1. As result, OUT# is pulled down and OUT is pulled up. The inverters I3 and I4 further latch the output OUT and OUT# to their states respectively. FIG. 7 is a timeline diagram illustrating various states of several nodes during the pre-charge phase and evaluation phase.

Note that although a variety of transistors are used to form various circuits, for example, the latch circuit, the SPDB circuit, and the termination circuit. It is not so limited. It will be appreciated that other components may be utilized.

Figure 8:
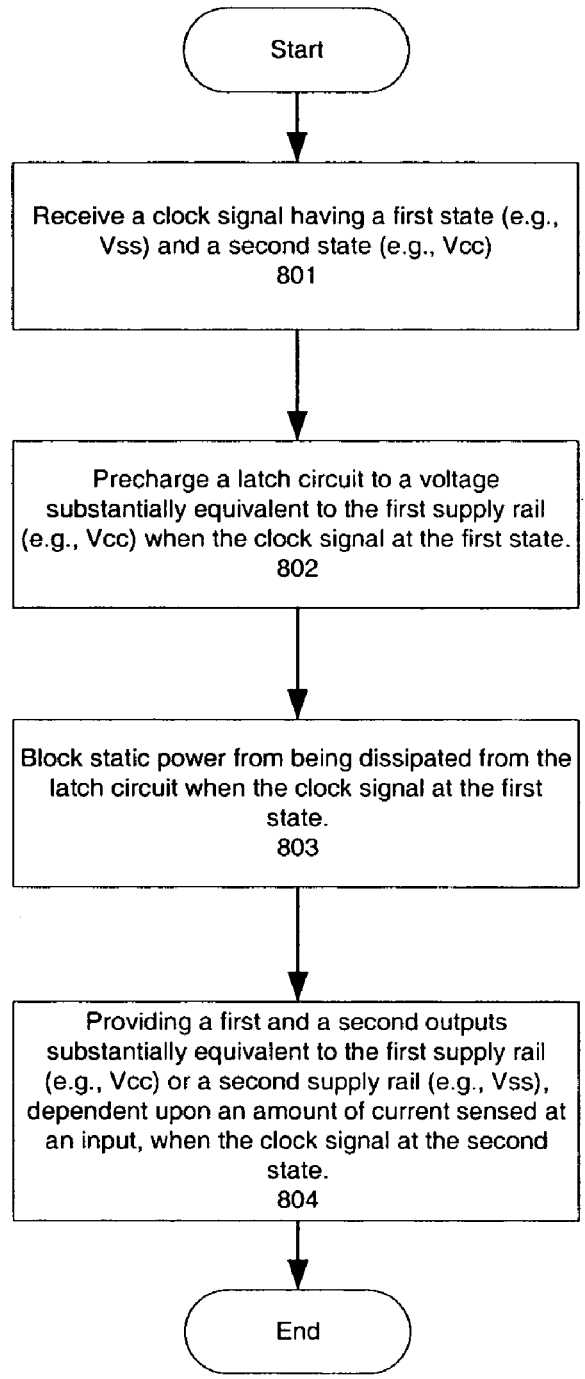
FIG. 8 is a flow diagram illustrating a process example performed by a receiver circuit in accordance with one embodiment.

FIG. 8 is a flow diagram illustrating a process example performed by a receiver circuit in accordance with one embodiment. For example, the process example 800 may be performed by the receiver circuit examples 500 of FIG. 5 and/or 600 of FIG. 6. In one embodiment, process example 800 includes, but is not limited to, pre-charging a latch circuit during a pre-charge phase, blocking static power from being dissipated from the latch circuit during the pre-charge phase, and latching values for a first output and a second output of the latch circuit during an evaluation phase in response to an input.

Referring to FIG. 8, at block 801, a clock signal (e.g., CLK signal) is received. The clock signal includes a first state and a second state. In one embodiment, the first state may be substantially equivalent to the second supply rail Vss and the second state may be substantially equivalent the first supply rail Vcc as described above. At block 802, when the clock signal is at the first state (e.g., a pre-charge phase), the latch circuit is pre-charged to a voltage substantially closed to the first supply rail Vcc. Meanwhile, at block 803, static power is blocked to be dissipated from the latch circuit when the clock signal is at the first state. In one embodiment, the static power is blocked by substantially isolating the latch circuit from the termination circuit. When the clock signal swings from the first state to the second state (e.g., an evaluation phase), at block 804, a first and a second outputs are provided substantially equivalent to the first supply rail Vcc or a second supply rail Vss, dependent upon an amount of current sensed at an input. Other operations may also be performed.

Figure 9:
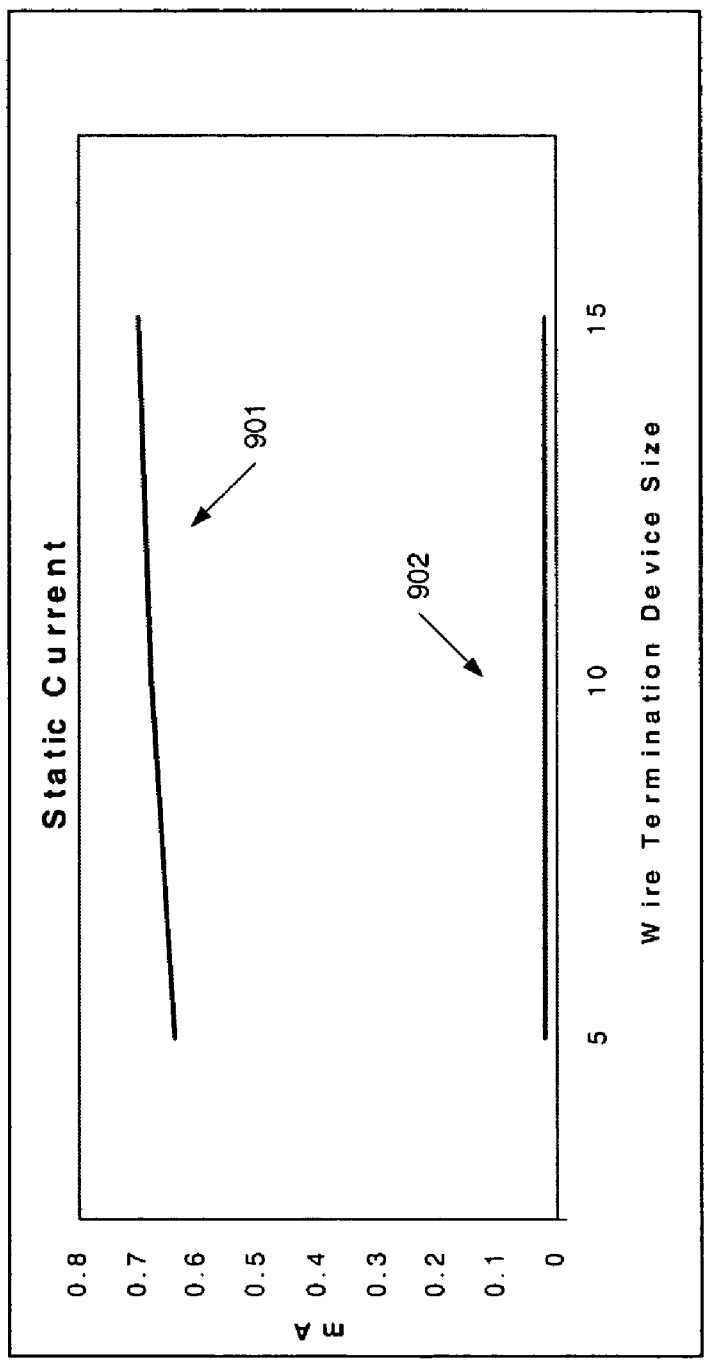
FIG. 9 is a diagram illustrating an amount of static power consumed by a convention receiver circuit and by a receiver circuit according to certain embodiments.

FIG. 9 is a diagram illustrating an amount of static power consumed by a convention receiver circuit and by a receiver circuit according to certain embodiments. As shown in FIG. 9, the static current 901 increases slightly with respect to the wire termination device size in a conventional receiver circuit. However, a substantial low amount of static current 902 is consumed by a receiver circuit of an embodiment. The small amount of static current (e.g., 18 micro-amperes) consumed by the embodiments of the receivers may be due to leakage.

Figure 10:
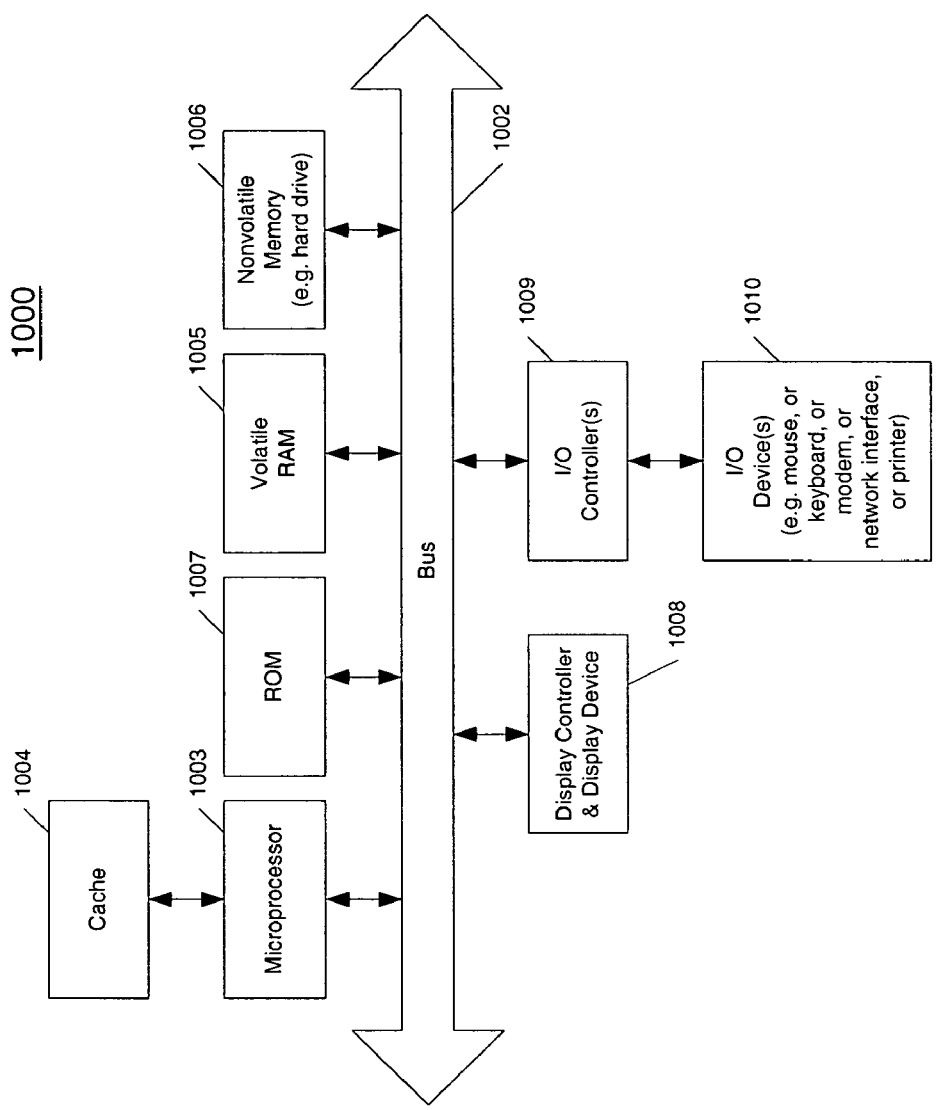
FIG. 10 is a block diagram of a computer example which may be used with an embodiment.

FIG. 10 is a block diagram of a computer example which may be used with an embodiment. For example, system 1000 shown in FIG. 10 may include a bus having one or more interconnects implemented as an example of interconnects shown in FIG. 4. Some or all of the interconnects may include a receiver circuit similar to those shown in FIGS. 5 and 6. Note that while FIG. 10 illustrates various components of a computer system, it is not intended to represent any particular architecture or manner of interconnecting the components, as such details are not germane to the present invention. It will also be appreciated that network computers, handheld computers, cell phones, and other data processing systems which have fewer components or perhaps more components may also be used with the present invention.

As shown in FIG. 10, the computer system 1000, which is a form of a data processing system, includes a bus 1002 which is coupled to a microprocessor 1003 and a ROM 1007, a volatile RAM 1005, and a non-volatile memory 1006. The microprocessor 1003, which may be, for example, a Pentium processor from Intel Corporation or a PowerPC processor from Motorola, Inc., is coupled to cache memory 1004 as shown in the example of FIG. 10. The bus 1002 interconnects these various components together and also interconnects these components 1003, 1007, 1005, and 1006 to a display controller and display device 1008, as well as to input/output (I/O) devices 1010, which may be mice, keyboards, modems, network interfaces, printers, and other devices which are well-known in the art. These components may be coupled to each other via one or more interconnects having a receiver circuit similar to those shown in FIGS. 5 and 6.

Typically, the input/output devices 1010 are coupled to the system through input/output controllers 1009. The volatile RAM 1005 is typically implemented as dynamic RAM (DRAM) which requires power continuously in order to refresh or maintain the data in the memory. The non-volatile memory 1006 is typically a magnetic hard drive, a magnetic optical drive, an optical drive, or a DVD RAM or other type of memory system which maintains data even after power is removed from the system. Typically the non-volatile memory will also be a random access memory, although this is not required. While FIG. 10 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface.

The bus 1002 may include one or more buses connected to each other through various bridges, controllers, and/or adapters, as is well-known in the art. In one embodiment, the I/O controller 1009 includes a USB (Universal Serial Bus) adapter for controlling USB peripherals or a PCI controller for controlling PCI devices, which may be included in IO devices 1010. In a further embodiment, I/O controller 1009 includes an IEEE-1394 controller for controlling IEEE-1394 devices, also known as FireWire devices. Other components may also be implemented.

Thus, a static power free receiver circuit has been described herein. In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A receiver circuit, comprising:
a latch circuit to latch values for a first output and a second output during an evaluation phase in response to an input received from a data line, the first and second outputs providing outputs latched by the latch circuit during the evaluation phase dependent upon an amount of current associated with the input;
a pre-charge circuit coupled to the latch circuit to pre-charge the latch circuit during a pre-charge phase; and
a static power dissipation blocking (SPDB) circuit directly coupled to the pre-charge circuit and the latch circuit to substantially block static power from being dissipated from the latch circuit during the pre-charge phase.

2. The receiver circuit of claim 1, further comprising a termination circuit coupled to the SPDB circuit to provide relatively low impedance path during the evaluation phase.

3. The receiver circuit of claim 2, further comprising an input circuit coupled to the SPDB circuit and the termination circuit to receive the input.

4. The receiver circuit of claim 3, wherein during the evaluation phase, the latch circuit is to latch a first value to the first output and to latch a second value to the second output when the amount of current sensed at the input circuit exceeds a first predetermined threshold, the first value being higher than the second value.

5. The receiver circuit of claim 4, wherein during the evaluation phase, the latch circuit is to latch the second value to the first output and to latch first value to the second output when the amount of current sensed at the input circuit drops below a second predetermined threshold.

6. The receiver circuit of claim 4, further comprising:
a first supply rail having a first supply voltage coupled to the pre-charge circuit; and
a second supply rail having a second supply voltage coupled to the termination circuit, the first supply voltage being higher than the second supply voltage, wherein the first value being outputted is substantially equivalent to the first supply voltage and the second value outputted is substantially equivalent to the second supply voltage.

7. The receiver circuit of claim 5, wherein the first and second predetermined thresholds are determined based on at least one characteristics of the termination circuit.

8. The receiver circuit of claim 3, further comprising a clock input circuit coupled to the pre-charge circuit and the SPDB circuit to receive a clock signal, wherein the pre-charge phase occurs when the clock signal is at a first state and the evaluation phase occurs when the clock signal is at a second state.

9. The receiver circuit of claim 8, wherein the pre-charge circuit is to pre-charge the latch circuit when the clock signal is at the first state, and wherein the latch circuit is to latch values to the first and second outputs when the clock signal is at the second state dependent upon the input sensed at the input circuit.

10. A receiver circuit, comprising:
a latch circuit to latch values for a first output and a second output during an evaluation phase in response to an input received from a data line, the first and second outputs providing outputs latched by the latch circuit during the evaluation phase dependent upon an amount of current associated with the input;
a pre-charge circuit coupled to the latch circuit to pre-charge the latch circuit during a pre-charge phase;
a static power dissipation blocking (SPDB) circuit directly coupled to the pre-charge circuit and the latch circuit to substantially block static power from being dissipated from the latch circuit during the pre-charge phase; and a termination circuit coupled to the SPDB circuit to provide relatively low impedance path during the evaluation phase, wherein the SPDB circuit is to isolate the latch circuit and the termination circuit during the pre-charge phase, such that substantially low current flows through the termination circuit during the pre-charge phase.

11. The receiver circuit of claim 10, wherein the SPBD circuit is to allow a current flowing from the latch circuit to the termination circuit during the evaluation phase.

12. An interconnect, comprising:
a driver to drive signals onto the interconnect; and
a receiver coupled to the driver to receive signals from the driver as an input, the receiver including
a latch circuit to latch values for a first output and a second output during an evaluation phase in response to an input received from a data line, the first and second outputs providing outputs latched by the latch circuit during the evaluation phase dependent upon an amount of current associated with the input,
a pre-charge circuit coupled to the latch circuit to pre-charge the latch circuit during a pre-charge phase, and
a static power dissipation blocking (SPDB) circuit directly coupled to the pre-charge circuit and the latch circuit to substantially block static power from being dissipated from the latch circuit during the pre-charge phase.

13. The interconnect of claim 12, wherein the receiver further comprises a termination circuit coupled to the SPDB circuit to provide relatively low impedance path during the evaluation phase.

14. The interconnect of claim 13, wherein the receiver further comprises an input circuit coupled to the SPDB circuit and the termination circuit to receive the input.

15. The interconnect of claim 14, wherein during the evaluation phase, the latch circuit is to latch a first value to the first output and to latch a second value to the second output when the amount of current sensed at the input circuit exceeds a first predetermined threshold, the first value being higher than the second value.

16. The interconnect of claim 15, wherein during the evaluation phase, the latch circuit is to latch the second value to the first output and to latch first value to the second output when the amount of current sensed at the input circuit drops below a second predetermined threshold.

17. An interconnect, comprising:
a driver to drive signals onto the interconnect; and
a receiver coupled to the driver to receive signals from the driver as an input, the receiver including
a latch circuit to latch values for a first output and a second output during an evaluation phase in response to an input received from a data line, the first and second outputs providing outputs latched by the latch circuit during the evaluation phase dependent upon an amount of current associated with the input,
a pre-charge circuit coupled to the latch circuit to pre-charge the latch circuit during a pre-charge phase,
a static power dissipation blocking (SPDB) circuit directly coupled to the pre-charge circuit and the latch circuit to substantially block static power from being dissipated from the latch circuit during the pre-charge phase, and
a termination circuit coupled to the SPDB circuit to provide relatively low impedance path during the evaluation phase, wherein the SPDB circuit is to isolate the latch circuit and the termination circuit during the pre-charge phase, such that substantially low current flows through the termination circuit during the pre-charge phase.

18. A bus, comprising:
one or more interconnects to couple one or more components onto the bus, at least one interconnect comprising
a driver to drive signals onto the interconnect, and
a receiver coupled to the driver to receive signals from the driver as an input, the receiver including
a latch circuit to latch values for a first output and a second output during an evaluation phase in response to an input received from a data line, the first and second outputs providing outputs latched by the latch circuit during the evaluation phase dependent upon an amount of current associated with the input,
a pre-charge circuit coupled to the latch circuit to pre-charge the latch circuit during a pre-charge phase, and
a static power dissipation blocking (SPDB) circuit directly coupled to the pre-charge circuit and the latch circuit to substantially block static power from being dissipated from the latch circuit during the pre-charge phase.

19. The bus of claim 18, wherein the receiver further comprises a termination circuit coupled to the SPDB circuit to provide relatively low impedance path during the evaluation phase.

20. The bus of claim 19, wherein the receiver further comprises an input circuit coupled to the SPDB circuit and the termination circuit to receive the input.

21. The bus of claim 20, wherein during the evaluation phase, the latch circuit is to latch a first value to the first output and to latch a second value to the second output when the amount of current sensed at the input circuit exceeds a first predetermined threshold, the first value being higher than the second value.

22. The bus of claim 21, wherein during the evaluation phase, the latch circuit is to latch the second value to the first output and to latch first value to the second output when the amount of current sensed at the input circuit drops below a second predetermined threshold.

23. A bus, comprising:
one or more interconnects to couple one or more components onto the bus, at least one interconnect comprising
a driver to drive signals onto the interconnect, and
a receiver coupled to the driver to receive signals from the driver as an input, the receiver including
a latch circuit to latch values for a first output and a second output during an evaluation phase in response to an input received from a data line, the first and second outputs providing outputs latched by the latch circuit during the evaluation phase dependent upon an amount of current associated with the input,
a pre-charge circuit coupled to the latch circuit to pre-charge the latch circuit during a pre-charge phase.
a static power dissipation blocking (SPDB) circuit directly coupled to the pre-charge circuit and the latch circuit to substantially block static power from being dissipated from the latch circuit during the pre-charge phase, and
a termination circuit coupled to the SPDB circuit to provide relatively low impedance path during the evaluation phase, wherein the SPDB circuit is to isolate the latch circuit and the termination circuit during the pre-charge phase, such that substantially low current flows through the termination circuit during the pre-charge phase.

24. A system, comprising:
a processor; and
a bus coupled to the processor having one or more interconnects to couple one or more components onto the bus, at least one interconnect comprising
 a driver to drive signals onto the interconnect, and
 a receiver coupled to the driver to receive signals from the driver as an input, the receiver including
  a latch circuit to latch values for a first output and a second output during an evaluation phase in response to an input received from a data line, the first and second outputs providing outputs latched by the latch circuit during the evaluation phase dependent upon an amount of current associated with the input,
  a pre-charge circuit coupled to the latch circuit to pre-charge the latch circuit during a pre-charge phase, and
  a static power dissipation blocking (SPDB) circuit directly coupled to the pre-charge circuit and the latch circuit to substantially block static power from being dissipated from the latch circuit during the pre-charge phase.

25. The system of claim 24, wherein the receiver further comprises a termination circuit coupled to the SPDB circuit to provide relatively low impedance path during the evaluation phase.

26. The system of claim 25, wherein the receiver further comprises an input circuit coupled to the SPDB circuit and the termination circuit to receive the input.

27. A system, comprising:
a processor; and
a bus coupled to the processor having one or more interconnects to couple one or more components onto the bus, at least one interconnect comprising
 a driver to drive signals onto the interconnect, and
 a receiver coupled to the driver to receive signals from the driver as an input, the receiver including
  a latch circuit to latch values for a first output and a second output during an evaluation phase in response to an input received from a data line, the first and second outputs providing outputs latched by the latch circuit during the evaluation phase dependent upon an amount of current associated with the input,
  a pre-charge circuit coupled to the latch circuit to pre-charge the latch circuit during a pre-charge phase,
  a static power dissipation blocking (SPDB) circuit directly coupled to the pre-charge circuit and the latch circuit to substantially block static power from being dissipated from the latch circuit during the pre-charge phase, and
  a termination circuit coupled to the SPDB circuit to provide relatively low impedance path during the evaluation phase, wherein the SPDB circuit is to isolate the latch circuit and the termination circuit during the pre-charge phase, such that substantially low current flows through the termination circuit during the pre-charge phase.

* * * * *